US006608710B1

United States Patent
Battagin

(12) United States Patent
(10) Patent No.: US 6,608,710 B1
(45) Date of Patent: Aug. 19, 2003

(54) AUTOMATIC GAIN CONTROL CIRCUIT AND OPTICAL RECEIVER

(75) Inventor: Adrian A. Battagin, Toronto (CA)

(73) Assignee: Leitch Technology International Inc., Toronto (CA)

( * ) Notice: Subject to any disclaimer, the term of this patent is extended or adjusted under 35 U.S.C. 154(b) by 0 days.

(21) Appl. No.: 09/559,068

(22) Filed: Apr. 28, 2000

(30) Foreign Application Priority Data

Jan. 31, 2000 (CA) .............................................. 2297716

(51) Int. Cl.[7] .............................................. H04B 10/06
(52) U.S. Cl. ........................ 359/194; 359/189; 375/316; 375/317; 375/318; 375/319; 250/214 A; 250/214 AG; 330/59; 330/308
(58) Field of Search ................................. 359/189, 194; 375/316, 317, 318, 319; 250/214 A, 214 AG; 330/59, 308

(56) References Cited

U.S. PATENT DOCUMENTS

| 4,371,842 | A |   | 2/1983  | Lee ............................. 330/141 |
| 5,515,004 | A |   | 5/1996  | Alford et al. ................ 330/254 |
| 5,606,294 | A |   | 2/1997  | Richards ..................... 331/109 |
| 5,699,017 | A |   | 12/1997 | Maejima ..................... 330/280 |
| 5,793,512 | A |   | 8/1998  | Ryu ............................ 359/179 |
| 5,867,514 | A |   | 2/1999  | Anderson .................... 372/38 |
| 5,917,639 | A | * | 6/1999  | Ushirozawa ................ 359/194 |
| 5,933,265 | A |   | 8/1999  | Nagarajan ................... 359/189 |
| 5,970,078 | A |   | 10/1999 | Walker ........................ 372/38 |
| 6,151,150 | A | * | 11/2000 | Kikuchi ...................... 359/194 |
| 6,275,541 | B1 | * | 8/2001 | Nagahori et al. ........... 375/318 |
| 6,304,357 | B1 | * | 10/2001 | Ohhata et al. .............. 359/194 |

OTHER PUBLICATIONS

Hewlett Packard Co.: Silicon Bipolar MMIC 1.5 GHz Variable Gain Amplifier. Technical Data, IV A–05208, 5965–9682E: pp. 1–4, Sep. 1997.
Gennum Corporation: HD–LINX™ GS1504, HDTV Adaptive Equalizer. Preliminary Data Sheet, Document No. 522–05–01: pp. 1–13, Aug. 1999.

* cited by examiner

Primary Examiner—Leslie Pascal
Assistant Examiner—Hanh Phan
(74) Attorney, Agent, or Firm—Dimock Stratton Clarizio; Mark B. Eisen

(57) ABSTRACT

An automatic gain control circuit for an optical receiver couples the low level signal produced by an optical detector to a signal amplifier, preferably a double-ended differential amplifier with the optical detector output fed into the high input and the low input coupled to ground, the gain of which is controlled by a negative feedback circuit. The feedback circuit comprises a signal level detection circuit coupled to the amplifier output, such as high-speed Schottky diodes acting in conjunction with an operational amplifier. The Schottky diodes are coupled to ground through AC coupling capacitors, and oriented in opposite directions, so when the amplified signal exceeds a conduction threshold of the Schottky diodes the capacitors are respectively charged and drained, establishing a voltage difference between the input terminals of the operational amplifier. The resulting current output from the operational amplifier to reduce the voltage difference is also fed to the gain control pin of the signal amplifier, reducing its gain. The differential output signal is equalized for transmission to switching, routing or processing equipment or to an HDTV receiver.

20 Claims, 4 Drawing Sheets

Typical Eye Diagram

AUTOMATIC GAIN CONTROL CIRCUIT AND OPTICAL RECEIVER

FIELD OF INVENTION

This invention relates to automatic gain control circuits. In particular, this invention relates to an automatic gain control circuit particularly suitable for processing the output of an optical detector converting optical high-definition television signals to electrical signals for transmission to a receiver.

BACKGROUND OF THE INVENTION

Optical fiber has become a popular medium for the transmission of telecommunications signals. The speed and accuracy of optical signals allows for the transmission of large volumes of information over a single optical fiber, and with current compression techniques the capacity of optical fiber transmission systems is virtually unlimited. Thus, optical fiber transmission systems are particularly useful for high speed transmissions involving large concentrations of data, such as high-definition television signals.

However, telecommunications equipment such as transmitters and receivers still operate by processing electrical signals. In a typical digital television receiver, for example, data is input to the receiver circuitry as a series of electrical pulses. These pulses represent pixel image data such as chrominance and luminance, synchronization data such as horizontal sync, vertical sync and frame sync, along with other characteristics of the televised image and associated data such as audio, closed captioning etc. The electrical pulses occupy standardized positions within a telecommunications signal, which are thus decoded by the receiver circuitry to create an image on the television screen.

High-definition television (HDTV) has presented a considerable challenge to conventional telecommunications technologies, due to the volume of information required to construct an HDTV image. Fiber optic telecommunications technology provides a partial solution, since the data rate of optical fiber transmissions easily accommodates the 1.485 Gb/s data rate standard for HDTV transmissions. However, an opto-electric coupler interface is required which is capable of translating optical (typically laser-generated) pulses received from an optical fiber to corresponding electrical pulses which can be processed by an HDTV receiver.

One type of opto-electric coupler suitable for standard optically transmitted telecommunications signals is a laser optical receiver, which emits a low level electric pulse corresponding to each optical pulse sensed by an optical detector. Existing laser optical receivers are capable of resolving optical pulses only to a power level of approximately –15 dBm. However, SMPTE specification 292M for a laser optical receiver for HDTV applications requires that the sensitivity of the receiver extend to at least –20 dBm.

Conventional optical detectors tend to poorly process so-called "pathological" signals, i.e. signals having large numbers of consecutive zeros or ones, because of the high DC content and low frequency content resulting from the absence of zero-to-one and one-to-zero crossover points. Also, the output signal level from a conventional optical detector tends to fluctuate widely, while the DC restoration circuitry used to equalize the signal output from the optical receiver requires a relatively constant input signal in order to perform properly. Thus, conventional optical receivers are poorly suited for use in high-speed applications such as HDTV.

SUMMARY OF THE INVENTION

The present invention overcomes these disadvantages by providing an optical receiver having a sensitivity extending well below –20 dBm, and an automatic gain control circuit therefor. The gain control circuit of the invention is self-stabilizing and provides a consistently accurate and uniform output signal level to the DC restoration circuitry, even under pathological signal conditions.

The invention accomplishes this by coupling the low level signal produced by an optical detector to a signal amplifier, the gain of which is controlled by a negative feedback circuit. The feedback circuit comprises a signal level detection circuit coupled to the amplifier output, in the preferred embodiment comprising high-speed Schottky diodes acting in conjunction with an operational amplifier. The Schottky diodes are coupled to ground through AC bypass capacitors, and oriented in opposite directions. Thus, when the amplified signal exceeds a conduction threshold of the Schottky diodes the AC bypass capacitors are respectively charged and drained, establishing a voltage difference between the input terminals of the operational amplifier. A current output from the operational amplifier to reduce the voltage difference is also fed to the gain control pin of the signal amplifier, reducing its gain.

The circuit of the invention thus establishes a negative feedback loop with the differential amplifier, to maintain a constant differential signal output level. The differential output signal is equalized for transmission to switching, routing or processing equipment or to an HDTV receiver.

In the preferred embodiment the amplifier is a double-ended differential amplifier, with the optical detector output fed into the high input and the low input coupled to ground, and the signal level detection circuit coupled in parallel to the differential outputs. Also, in the preferred embodiment the Schottky diode circuit clips peak levels of the differential output signal whenever they exceed a saturation voltage, which further stabilizes the differential output signal and avoids overloading of the DC restoration circuitry.

The present invention thus provides an automatic gain control circuit, comprising a differential amplifier having a high input adapted to receive a high input signal, a low input adapted to receive a low input signal, a high output for outputting an amplified high output signal, a low output for outputting an amplified low output signal substantially symmetrical with the high output signal, and a gain control input for receiving a gain control signal which controls the gain of the differential amplifier, and a feedback circuit comprising a signal level detection circuit comprising a first pair of diodes having coupled anodes and having cathodes respectively connected to the high output and low output, and a second pair of diodes having coupled cathodes and having anodes respectively connected to the high output and low output, and an operational amplifier having an inverting input connected to the coupled anodes of the first pair of diodes and to a first end of a first capacitor, a non-inverting input connected to the coupled cathodes of the second pair of diodes and to a first end of a second capacitor, the other ends of the first and second capacitors being connected to ground, and an output connected through a resistor to the inverting input and connected to the coupled anodes of the first pair of diodes, wherein an increase in the level of the amplified output signals causes a current to be withdrawn from the first capacitor which lowers a voltage at the inverting input and causes a current to be injected into the second capacitor which raises a voltage at the non-inverting input, causing a voltage difference between the output of the operational amplifier and the inverting input, whereby current flowing from the output of the operational amplifier to the inverting input flows to the gain control input of the differential amplifier to reduce the gain of the differential amplifier.

The present invention further provides an optical receiver for converting an optical signal to an electrical signal, comprising an optical detector for producing an electrical input signal corresponding to an optical input signal detected by the optical detector, a differential amplifier having a high input adapted to receive the electrical input signal, a low input adapted to receive a low input signal, a high output for outputting an amplified high output signal, a low output for outputting an amplified low output signal substantially symmetrical with the high output signal, and a gain control input for receiving a gain control signal which controls the gain of the differential amplifier, and a feedback circuit comprising a signal level detection circuit comprising a first pair of diodes having coupled anodes and having cathodes respectively connected to the high output and low output, and a second pair of diodes having coupled cathodes and having anodes respectively connected to the high output and low output, and an operational amplifier having an inverting input connected to the coupled anodes of the first pair of diodes and to a first end of a first capacitor, a non-inverting input connected to the coupled cathodes of the second pair of diodes and to a first end of a second capacitor, the other ends of the first and second capacitors being connected to ground, and an output connected through a resistor to the inverting input and connected to the coupled anodes of the first pair of diodes, wherein an increase in the level of the amplified output signals causes a current to be withdrawn from the first capacitor which lowers a voltage at the inverting input and causes a current to be injected into the second capacitor which raises a voltage at the non-inverting input, causing a voltage difference between the output of the operational amplifier and the inverting input, whereby current flowing from the output of the operational amplifier to the inverting input flows to the gain control input of the differential amplifier to reduce the gain of the differential amplifier.

The present invention further provides an automatic gain control circuit, comprising an amplifier having an input adapted to receive an electrical input signal, an output for outputting an amplified output signal, and a gain control input for receiving a gain control signal which controls the gain of the amplifier, and a feedback circuit comprising a signal level detection circuit comprising a first pair of diodes having coupled anodes and having cathodes respectively connected to the output and to a reference voltage, and a second pair of diodes having coupled cathodes and having anodes respectively connected to the output and to the reference voltage, and an operational amplifier having an inverting input connected to the coupled anodes of the first pair of diodes and to a first end of a first capacitor, a non-inverting input connected to the coupled cathodes of the second pair of diodes and to a first end of a second capacitor, the other ends of the first and second capacitors being connected to ground, and an output connected through a resistor to the inverting input and connected to the coupled anodes of the first pair of diodes, wherein an increase in the level of the amplified output signal causes a current to be withdrawn from the first capacitor which lowers a voltage at the inverting input and causes a current to be injected into the second capacitor which raises a voltage at the non-inverting input, causing a voltage difference between the output of the operational amplifier and the inverting input, whereby current flowing from the output of the operational amplifier to the inverting input flows to the gain control input of the differential amplifier to reduce the gain of the differential amplifier.

BRIEF DESCRIPTION OF THE DRAWINGS

In drawings which illustrate by way of example only a preferred embodiment of the invention.

DETAILED DESCRIPTION OF THE INVENTION

Figure 1:
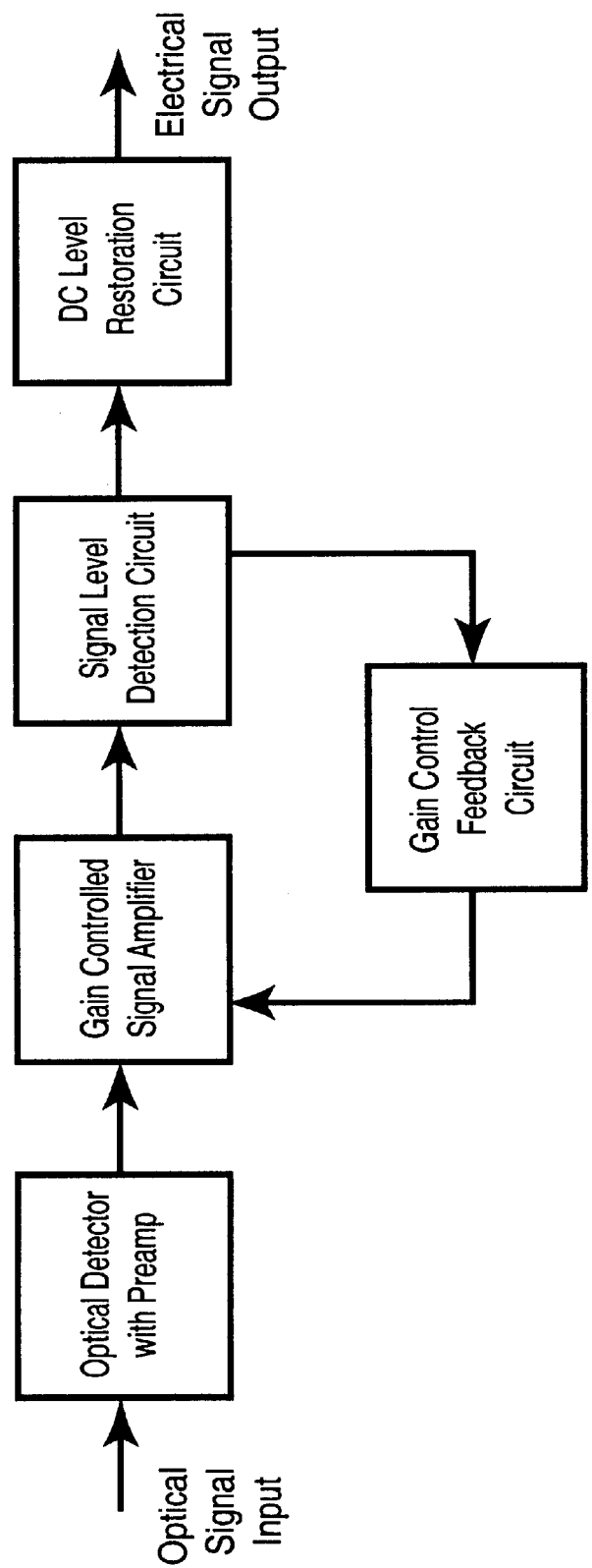
FIG. 1 is a block diagram illustrating an opto-electric coupler circuit of the invention.
Figure 2A:
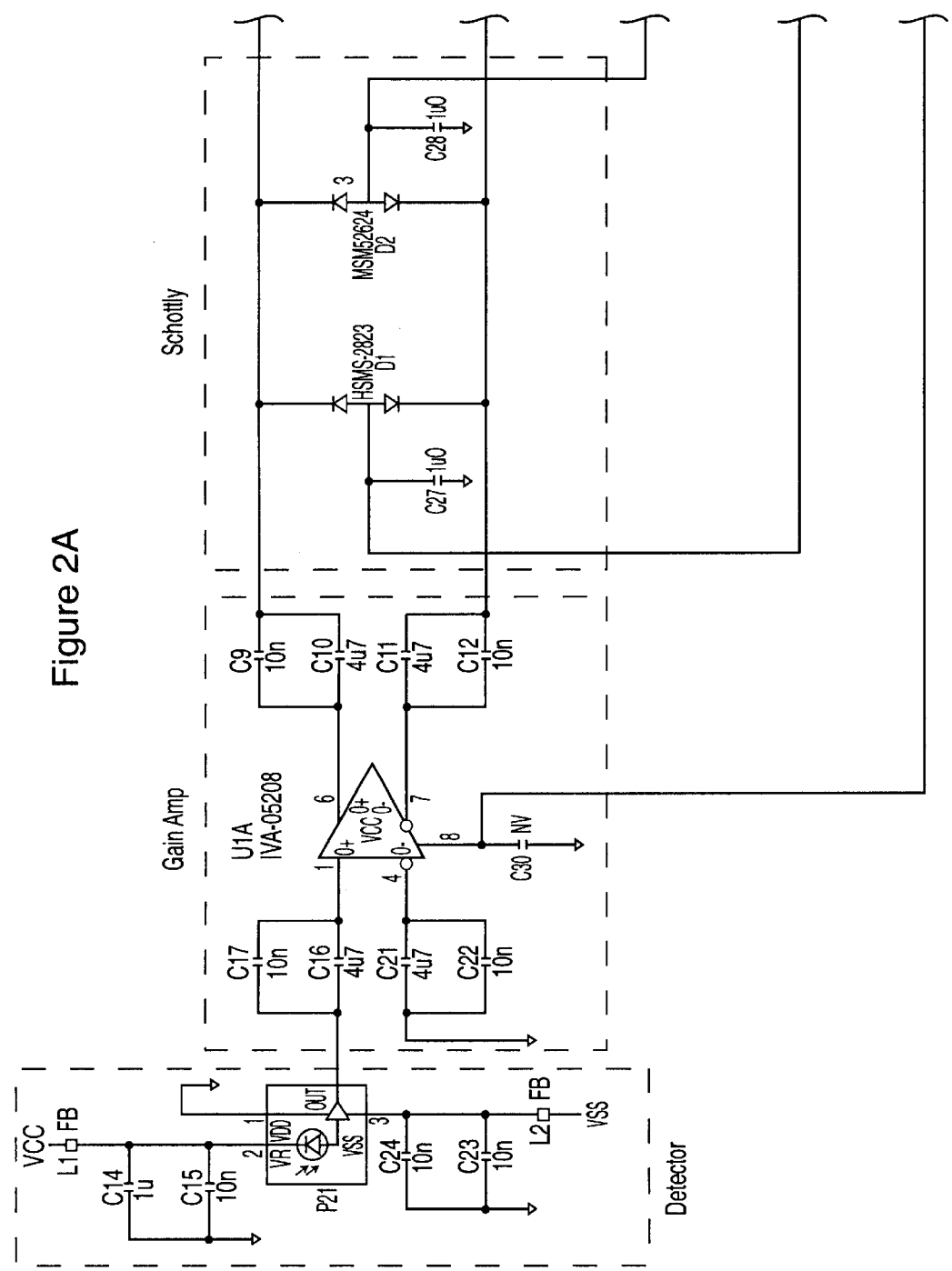
FIG. 2 is a schematic diagram of the opto-electric coupler circuit of FIG. 1.
Figure 2B:
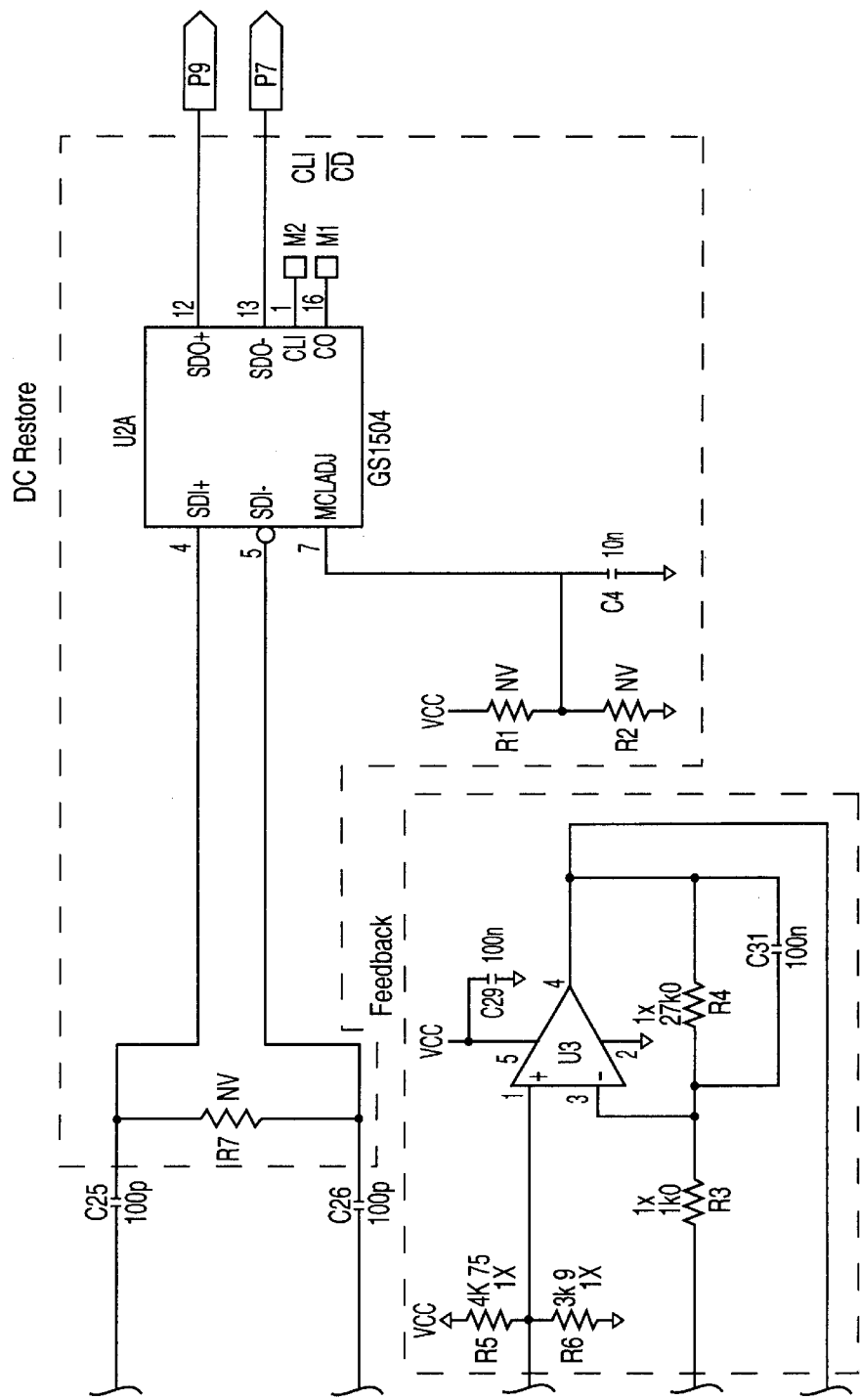
Figure 3:
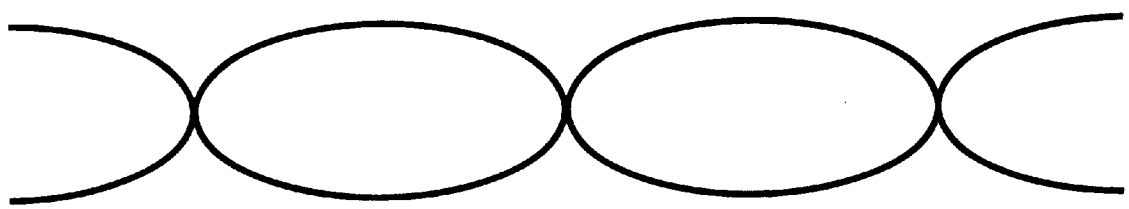
FIG. 3 illustrates the waveforms of an HDTV signal through the stages of the opto-electric coupler circuit of FIG. 1.

FIGS. 1 and 2 illustrate a preferred embodiment of the invention for converting a laser optical signal received through an optical fiber transmission system to a digital electrical signal adapted for processing by an HDTV receiver. The optical detector OD, for example FRM3Z231 by Fujitsu (Trademark), has an input optically coupled to an optical fiber transmission system (not shown) and a single-ended output for outputting an electrical input signal $V_{in}$ corresponding to the optical input signal.

The optical detector OD output is coupled to the high input pin 1 of a differential amplifier U1 through two AC coupling capacitors C16, C17. Capacitors C16, C17 provide a low RC time constant to stabilize pathological portions of the optical input signal, i.e. segments of the telecommunications signal having lengthy series of consecutive zeros or ones, which tend to have a large DC content and a low frequency content due to the absence of zero-to-one and one-to-zero crossovers and thus are subject to unusually high signal degradation.

The differential amplifier U1, for example a Hewlett-Packard (Trademark) IVA-05208 silicon bipolar 1.5 Ghz variable gain differential amplifier, has differential input and differential output capability. The low input pin 4 of the differential amplifier U1 is coupled to ground through capacitors C21, C22. A differential signal having a voltage $V_{out}$ proportional to the voltage drop between $V_{in}$ and ground is output as a differential signal $V_{out}$ represented by a voltage difference between the high signal $V_{out+}$ output from pin 6 and the low signal $V_{out-}$ output from pin 7. The gain of the differential amplifier U1 is controlled by a feedback voltage $V_{gc}$ at gain control pin 8, provided by the feedback circuit FB described below.

The high signal output pin 6 and the low signal output pin 7 of the differential amplifier U1 are coupled to DC restoration circuit U2, for example a Gennum (Trademark) GS1504 HDTV adaptive equalizer which serves as a serial digital receiver interface, outputting a digital HDTV signal along standard 50Ω cable to an HDTV signal receiver or processor such as a router, distribution amplifier, switcher or the like.

The high signal output pin 6 and the low signal output pin 7 are also respectively coupled to a feedback circuit FB through capacitors C9, C10 and C11, C12. In the preferred embodiment the feedback circuit FB comprises a signal level detection circuit, connected in parallel with the equalizer U2, and an operational amplifier U3. The signal level detection circuit preferably comprises high-speed dual common anode diode D1 and high-speed dual common cathode diode D2. The diodes D1, D2 may for example be commercially available dual Schottky (surface-barrier) diodes, which are preferred for their high speed operation and sensitivity.

The common anodes of diode D1 are coupled to the inverting pin 3 of an operational amplifier U3, and the common cathodes of diode D3 are coupled to the non-inverting pin 1 of the operational amplifier U3. The output from pin 4 of the differential amplifier U3 is coupled through feedback circuit FB to the gain control pin 8 of differential amplifier U1, and through resistor R4 and capacitor C31 to the inverting input pin 3 of op amp U3. Input pin 3 of op amp U3 is coupled through resistor R3 to the damping capacitor C27.

In operation, the optical detector OD outputs a low power signal $V_{in}$ corresponding in frequency, and roughly proportional in amplitude, to optical pulses received from an optical fiber transmission system (not shown). The signal $V_{in}$ has a generally sinusoidal waveform, due to the very low output level of the detector OD (down to as low as −23 dBm), and can thus be considered as a low level analog input signal.

The signal $V_{in}$ is filtered through capacitors C16, C17, which help to stabilize pathological portions of the signal $V_{in}$, and input to high input pin 1 of differential amplifier U1. The low input pin 4 of differential amplifier U1 is biased to ground through capacitors C21, C22, which in the circuit illustrated with $V_{cc}=+5$ V and $V_{ss}=-5$ V is held at a slightly positive voltage by voltage divider VD.

The differential amplifier U1 outputs a differential signal having a voltage $V_{out}$ proportionate to the voltage drop between $V_{in}$ and ground, representing a voltage difference between a high signal $V_{out+}$ output from high signal output pin 6 and a mirror-image low signal $V_{out-}$ output from low signal output pin 7.

The differential output signal $V_{out}$ is AC coupled through capacitors C9, C10 and C11, C12, and input to SDI+ pin 4 and SDI− pin 5 of equalizer U2 for DC restoration. The output of the equalizer U2 is coupled to conventional 50Ω coaxial cable which routes the equalized signal to HDTV equipment for further processing, or to an HDTV receiver.

The gain of the differential amplifier U1 is controlled by a feedback voltage $V_{gc}$ at gain control pin 8, provided by the feedback circuit FB. When no light pulse is exciting optical detector OD, the circuit is at a steady state. In this state there is none or very little current flowing through R3 and hence R4, thus the output at pin 4 of operational amplifier U3 is approximately at the same potential as pins 1 and 3 of its input. The voltage divider VD sets up a low DC bias (for example around +2 V) at pin 1 of U3 and hence from output pin 4 of the operational amplifier U3 the gain control signal $V_{gc}$ is also low so the differential amplifier U1 is set to maximum gain. With no light pulse exciting the optical detector, the differential input to pins 4 and 5 of DC adaptive equalizer U2 is zero, and no signal is output from the optical receiver circuit.

When an optical pulse is detected by optical detector OD its output goes high and emits a signal $V_{in}$, which is filtered through capacitors C16, C17 and fed to input pin 1 of differential amplifier U1, which goes high. The voltage difference between pins 1 and 4 of differential amplifier U1 is amplified and output from pins 6 and 7 of differential amplifier U1 as symmetrical high and low signals $V_{out+}$ and $V_{out-}$, respectively, to produce differential output signal $V_{out}$.

When the differential output signal $V_{out}$ exceeds about 0.3 V (the conduction threshold of the Schottky diodes), common cathode diode D2 injects current into capacitor C28, causing pin 1 of operational amplifier U3 to go high. Similarly, since $V_{out+}$ and $V_{out-}$ are symmetrical, common anode diode D1 withdraws current from damping capacitor C27 and pin 3 of operational amplifier U3 goes low. The output voltage $V_{gc}$ from pin 4 of operational amplifier U3 goes high to bring the voltage at inverting input pin 3 up to the voltage at non-inverting input pin 1. At the same time, the output voltage $V_{gc}$ is fed back to gain control pin 8 of differential amplifier U1, reducing its gain.

The differential output signal $V_{out}$ is thus fed to the input of the DC restoration circuitry at a consistent peak level, well within the ideal operating range of the adaptive equalizer U2. The automatic gain control circuit of the invention thus provides the required sensitivity and dynamic range to, and compensates for fluctuations in, the low level output of the optical detector OD.

The diodes D1, D2 thus serve a number of purposes. Primarily the diodes D1, D2 act as a charge pump, pushing current into capacitor C28 and drawing current from capacitor C27 whenever the differential output signal $V_{out}$ rises, and thus act in conjunction with the operational amplifier U3 to create a negative feedback loop that controls the gain of differential amplifier U1. The diodes D1, D2 clip the signal $V_{out}$ when the level of signals $V_{out+}$ and $V_{out-}$ exceed a saturation voltage, which helps to reduce the likelihood of overloading adaptive equalizer U2. Diodes D1, D2 also provide some degree of loading due to the intrinsic impedance of the Schottky barrier, which helps to eliminate reflections at the standard HDTV frequency of 1.485 Gb/s. The diodes D1, D2 provide rf detection and a convenient means for termination to the circuit board transmission line. Furthermore, their symmetrical implementation provides symmetrical clipping and loading on the signal propagating along the transmission line.

Utilizing a differential amplifier U1 with differential input and differential output provides the advantage that the amplified output signal from the differential amplifier U1 is doubled in amplitude, which allows for greater control of the feedback voltage $V_{gc}$. This configuration also allows for better termination to the transmission line. However, a single-ended version of the automatic gain control circuit and optical receiver should also be effective, with one end of each diode D1, D2 connected to the amplified output and the other ends of the diodes coupled to a steady DC reference voltage.

A preferred embodiment of the invention having been thus described by way of example only, it will be apparent to those skilled in the art that certain modifications and adaptations may be made without departing from the scope of the invention. The invention includes all such embodiments as fall within the scope of the appended claims.

I claim:
1. An automatic gain control circuit, comprising
   a differential amplifier having
      a high input adapted to receive a high input signal,
      a low input adapted to receive a low input signal,
      a high output for outputting an amplified high output signal,
      a low output for outputting an amplified low output signal substantially symmetrical with the high output signal, and
      a gain control input for receiving a gain control signal which controls the gain of the differential amplifier, and a feedback circuit comprising
   a signal level detection circuit comprising a first pair of diodes having coupled anodes and having cathodes respectively connected to the high output and low output, and a second pair of diodes having coupled cathodes and having anodes respectively connected to the high output and low output, and
   an operational amplifier having an inverting input connected to the coupled anodes of the first pair of diodes and to a first end of a first capacitor, a non-inverting input connected to the coupled cathodes of the second pair of diodes and to a first end of a second capacitor, the other ends of the first and second capacitors being connected to ground, and an output connected through a resistor to the inverting input and connected to the coupled anodes of the first pair of diodes,
   wherein an increase in the level of the amplified output signals causes a current to be withdrawn from the first capacitor which lowers a voltage at the inverting input and causes a current to be injected into the second capacitor which raises a voltage at the non-inverting input, causing a voltage difference between the output of the operational amplifier and the inverting input, whereby current flowing from the output of the operational amplifier to the inverting input flows to the gain control input of the differential amplifier to reduce the gain of the differential amplifier.

2. The automatic gain control circuit of claim 1 in which the diodes are Schottky diodes.

3. The automatic gain control circuit of claim 1 comprising a DC restore circuit connected in parallel to the cathodes of the first pair of diodes and to the anodes of the second pair of diodes.

4. The automatic gain control circuit of claim 1 in which a DC bias is established at the high and low inputs of the differential amplifier by a voltage divider.

5. The automatic gain control circuit of claim 1 in which the inverting input of the operational amplifier is connected through a resistor to the first capacitor.

6. The automatic gain control circuit of claim 1 in which the low input of the differential amplifier is connected to ground.

7. The automatic gain control circuit of claim 1 in which the high input of the differential amplifier is connected to the output of an optical detector.

8. The automatic gain control circuit of claim 7 in which the high input of the differential amplifier is connected to the output of an optical detector through at least one filtering capacitor.

9. The automatic gain control circuit of claim 1 in which the input signal is an HDTV signal.

10. The automatic gain control circuit of claim 1 in which the high output and the low output of the differential amplifier and the tapping circuit are AC coupled.

11. An optical receiver for converting an optical signal to an electrical signal, comprising
   an optical detector for producing an electrical input signal corresponding to an optical input signal detected by the optical detector,
   a differential amplifier having
      a high input adapted to receive the electrical input signal,
      a low input adapted to receive a low input signal,
      a high output for outputting an amplified high output signal,
      a low output for outputting an amplified low output signal substantially symmetrical with the high output signal, and
      a gain control input for receiving a gain control signal which controls the gain of the differential amplifier, and
   a feedback circuit comprising
      a signal level detection circuit comprising a first pair of diodes having coupled anodes and having cathodes respectively connected to the high output and low output, and a second pair of diodes having coupled cathodes and having anodes respectively connected to the high output and low output, and
      an operational amplifier having an inverting input connected to the coupled anodes of the first pair of diodes and to a first end of a first capacitor, a non-inverting input connected to the coupled cathodes of the second pair of diodes and to a first end of a second capacitor, the other ends of the first and second capacitors being connected to ground, and an output connected through a resistor to the inverting input and connected to the coupled anodes of the first pair of diodes,
   wherein an increase in the level of the amplified output signals causes a current to be withdrawn from the first capacitor which lowers a voltage at the inverting input and causes a current to be injected into the second capacitor which raises a voltage at the non-inverting input, causing a voltage difference between the output of the operational amplifier and the inverting input, whereby current flowing from the output of the operational amplifier to the inverting input flows to the gain control input of the differential amplifier to reduce the gain of the differential amplifier.

12. The optical receiver of claim 11 in which the diodes are Schottky diodes.

13. The optical receiver of claim 11 comprising a DC restore circuit connected in parallel to the cathodes of the first pair of diodes and to the anodes of the second pair of diodes.

14. The optical receiver of claim 11 in which a DC bias is established at the high and low inputs of the differential amplifier by a voltage divider.

15. The optical receiver of claim 11 in which the inverting input of the operational amplifier is connected through a resistor to the first capacitor.

16. The optical receiver of claim 11 in which the low input of the differential amplifier is connected to ground.

17. The optical receiver of claim 11 in which the high input of the differential amplifier is connected to the output of an optical detector through at least one filtering capacitor.

18. The optical receiver of claim 11 in which the input signal is an HDTV signal.

19. The optical receiver of claim 11 in which the high output and the low output of the differential amplifier and the tapping circuit are AC coupled.

20. An automatic gain control circuit, comprising
   an amplifier having an input adapted to receive an electrical input signal,
   an output for outputting an amplified output signal, and
   a gain control input for receiving a gain control signal which controls the gain of the amplifier; and
   a feedback circuit comprising
      a signal level detection circuit comprising a first pair of diodes having coupled anodes and having cathodes respectively connected to the output and to a reference voltage, and a second pair of diodes having coupled cathodes and having anodes respectively connected to the output and to the reference voltage, and an operational amplifier having an inverting input connected to the coupled anodes of the first pair of diodes and to a first end of a first capacitor, a non-inverting input connected to the coupled cathodes of the second pair of diodes and to a first end of a second capacitor, the other ends of the first and second capacitors being connected to ground, and an output connected through a resistor to the inverting input and connected to the coupled anodes of the first pair of diodes, wherein an increase in the level of the amplified output signal causes a current to be withdrawn from the first capacitor which lowers a voltage at the inverting input and causes a current to be injected into the second capacitor which raises a voltage at the non-inverting input, causing a voltage difference between the output of the operational amplifier and the inverting input, whereby current flowing from the output of the operational amplifier to the inverting input flows to the gain control input of the differential amplifier to reduce the gain of the differential amplifier.

* * * * *